United States Patent
Lee et al.

(10) Patent No.: US 8,270,557 B2
(45) Date of Patent: Sep. 18, 2012

(54) INTEGRATED CIRCUIT AND METHOD FOR DRIVING THE SAME

(75) Inventors: Ji-Wang Lee, Gyeonggi-do (KR); Shin-Deok Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 58 days.

(21) Appl. No.: 12/980,643

(22) Filed: Dec. 29, 2010

(65) Prior Publication Data

US 2012/0140870 A1   Jun. 7, 2012

(30) Foreign Application Priority Data

Dec. 3, 2010   (KR) .................. 10-2010-0122520

(51) Int. Cl.
*H03K 21/00* (2006.01)
(52) U.S. Cl. ............ 377/39; 327/141; 327/160; 327/291
(58) Field of Classification Search .................. None
See application file for complete search history.

(56) References Cited

U.S. PATENT DOCUMENTS

| | | | | |
|---|---|---|---|---|
| 4,420,814 A | * | 12/1983 | Arikawa et al. | ............... 702/148 |
| 4,503,549 A | * | 3/1985 | Slabinski | .................. 377/49 |
| 5,333,163 A | * | 7/1994 | Marumoto | ....................... 377/39 |
| 6,326,823 B1 | * | 12/2001 | Okui | ............................ 327/160 |
| 6,486,717 B2 | * | 11/2002 | Kinoshita et al. | ............. 327/175 |
| 7,639,058 B2 | * | 12/2009 | Kurokawa et al. | ............ 327/291 |

FOREIGN PATENT DOCUMENTS

| KR | 1020040037798 | 5/2004 |
|---|---|---|
| KR | 1020080092509 | 10/2008 |

OTHER PUBLICATIONS

Notice of Allowance issued by the Korean Intellectual Property Office on May 31, 2012.

* cited by examiner

*Primary Examiner* — Tuan T Lam
(74) *Attorney, Agent, or Firm* — IP & T Group LLP

(57) ABSTRACT

An integrated circuit includes a counter configured to perform a counting operation and output a count code value. The integrated circuit further includes an operation controller, a digital circuit and an alignment unit. The operation controller receives the count code value and generates a first control signal and a second control signal. The first control signal is generated, when the count code value is equal to a first value, which is counted by the counter prior to a target count value. The second control signal is generated, when the count code value is equal to the target count value. A digital circuit performs a first operation based on the first control signal, and output a digital signal. An alignment unit aligns the digital signal, and outputs the aligned digital signal as a final digital signal in response to the second control signal.

20 Claims, 10 Drawing Sheets

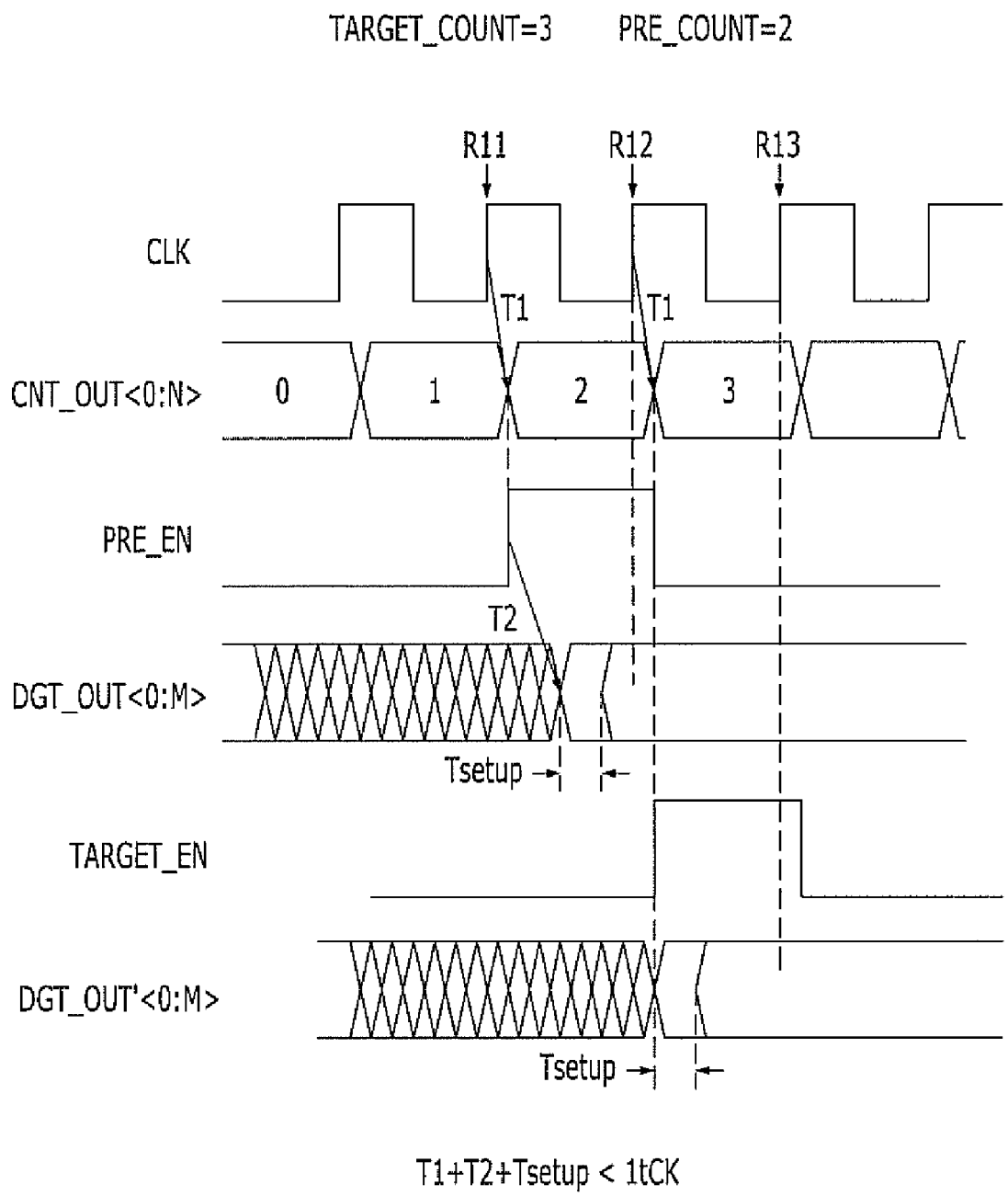

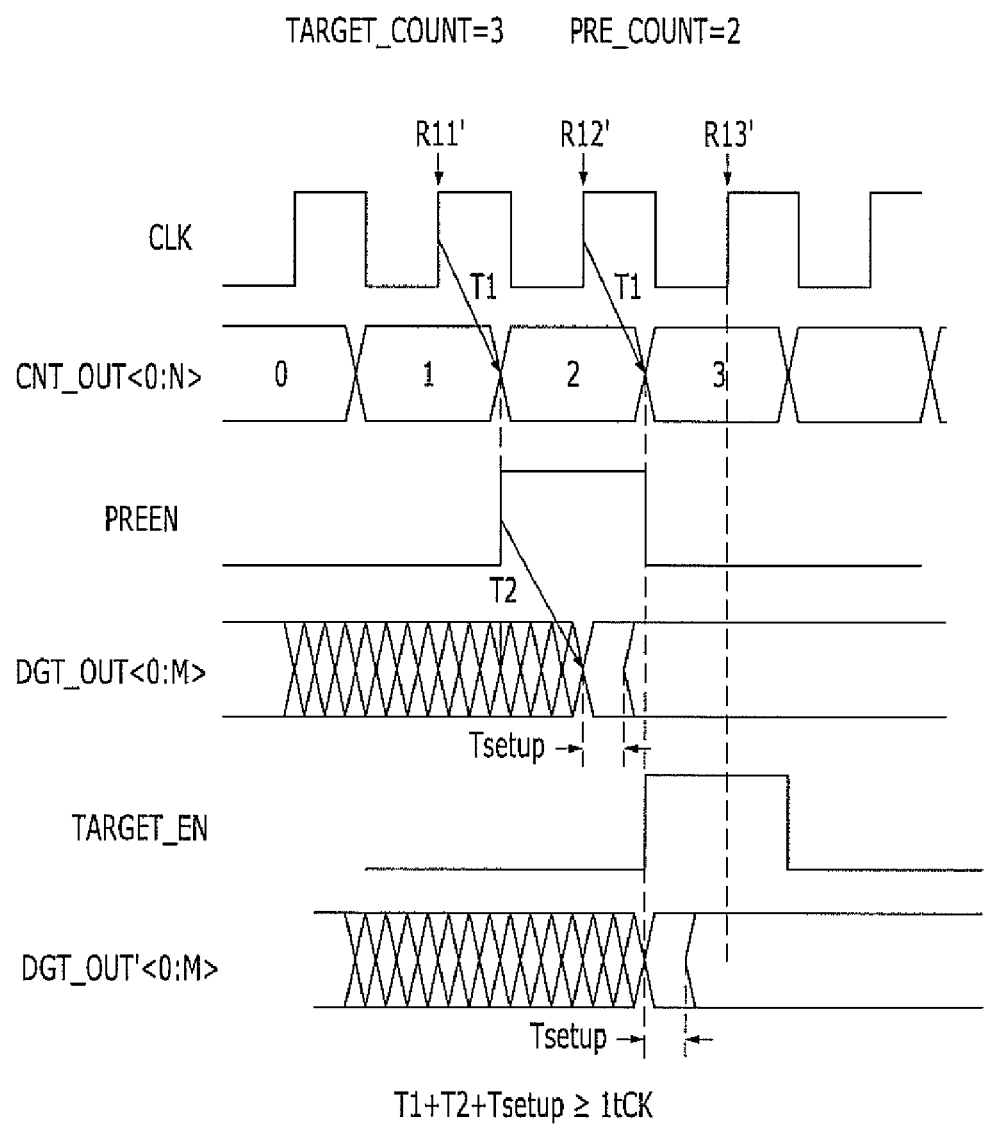

INTEGRATED CIRCUIT AND METHOD FOR DRIVING THE SAME

CROSS-REFERENCE TO RELATED APPLICATIONS

The present application claims priority of Korean Patent Application No. 10-2010-0122520, filed on Dec. 3, 2010, which is incorporated herein by reference in its entirety.

BACKGROUND OF THE INVENTION

Exemplary embodiments of the present invention relate to a semiconductor design technology, and more particularly, to a control circuit for controlling a digital circuit included in an integrated circuit and method for driving the control circuit.

FIG. 1 illustrates a block diagram for a conventional integrated circuit.

Referring to FIG. 1, an integrated circuit 100 includes a digital counter 110, a digital circuit 120, and an alignment unit 130. The digital counter 110 receives an enable signal EN, synchronizes the enable signal EN with a clock signal CLK, and outputs a count code value CNT_OUT<0:N>. The digital circuit 120 receives the count code value CNT_OUT<0:N> from the digital counter 110 and when the count code value CNT_OUT<0:N> is equal to a target value, performs a designated operation. The alignment unit 130 latches a digital signal DGT_OUT<0:M>, which is outputted from the digital circuit 120, synchronizes the digital signal DGT_OUT<0:M> with the clock signal CLK and outputs a final digital signal FDGT_OUT<0:M>.

Here, the digital counter 110 and the alignment unit 130 are synchronous circuits synchronized with the clock signal CLK, while the digital circuit 120 is a circuit that is not synchronized with the clock signal CLK.

An operation of the integrated circuit 100 is described follows.

FIG. 2 illustrates a timing diagram for illustrating the operation of the integrated circuit 100.

Hereinafter, the target value may be "3". When the count code value CNT_OUT<0:N> is equal to the target value "3", the digital circuit 120 performs the designated operation and outputs the digital signal DGT_OUT<0:M>.

Referring to FIG. 2, the digital counter 110 is responsive to the enable signal EN (as shown in FIG. 1), performs a count operation in synchronization with a rising edge of the clock signal CLK and outputs the count code value CNT_OUT<0:N>, which is counted in sequence. If the count code value CNT_OUT<0:N> is a 4-bit signal, the digital counter 110 will output a logical combination of 4-bit count code value CNT_OUT<0:3> to indicate a designated count value. For example, the digital counter 110 will output the count code value CNT_OUT<0:3> of "0000" to indicate a count value "0" and will output the count code value CNT_OUT<0:3> of "0011" to indicate a count value "3". Here, the count code value CNT_OUT<0:N> is delayed and outputted later than the rising edge of the clock signal CLK by a first delay time T1.

The digital circuit 120 receives the count code value CNT_OUT<0:N> from the digital counter 110 and when the count code value CNT_OUT<0:N> is equal to the target value "3", performs the intended operation and outputs the digital signal DGT_OUT<0:M>. The digital signal DGT_OUT<0:M> is delayed and outputted later than the count code value CNT_OUT<0:N> by a second delay time T2. Further, a setup margin time Tsetup exists between the digital signal DGT_OUT<0:M> and the clock signal CLK.

The alignment unit 130 aligns the digital signal DGT_OUT<0:M>, which is outputted from the digital circuit 120, and outputs the final digital signal FDGT_OUT<0:M> in synchronization with the clock signal CLK.

The conventional integrated circuit 100 has the following features.

Before describing the features of the conventional integrated circuit 100, a timing error will be described. The count code value CNT_OUT<0:N> is outputted in synchronization with a first rising edge R1 of the clock signal CLK, while the final digital signal FDGT_OUT<0:M> is outputted in synchronization with a second rising edge R2 of the clock signal CLK. That is, the clock edge R1 for outputting the count code value<0:N> corresponding to the target count value "3" is different from the clock edge R2 for outputting the final digital signal FDGT_OUT<0:M>, and an interval between the clock edge R1 and the clock edge R2 is equal to 1tCK, which is a period of the clock signal CLK. It is the result of the first delay time T1, the second delay time T2 and the setup margin time Tsetup. A total time of the first delay time T1, the second delay time T2 and the setup margin time Tsetup is less than the period of the clock signal CLK, i.e., 1tCK. Here, during a signal transmission, a signal delay is generated, and a timing difference between a signal input and a signal output is referred to as a timing error. For example, due to the timing error, the count code value CNT_OUT<0:N> corresponding to the target count value "3" is inputted at the first clock edge R1, and the final digital signal FDGT_OUT<0:M> is outputted at the second clock edge R2. At this time, if the values of the first delay time T1, the second delay time T2, and the setup margin time Tsetup are not changed, a timing interval between the timing (that is, first clock edge R1) for inputting the count code value CNT_OUT<0:N> corresponding to the target count value "3" and the timing (that is, the second clock edge R2) for outputting the final digital signal FDGT_OUT<0:M> will be the period of the clock signal CLK, i.e. 1tCK. Here, if the values of the first delay time T1, the second delay time T2 and the setup margin time Tsetup are not changed, the timing interval between a signal input timing and a signal output timing is known, such a timing error is not significant.

However, the first delay time T1, the second delay time T2 and the setup margin time Tsetup vary, as conditions of process (P), voltage (V), and temperature (T) are varied. Particularly, because the digital circuit 120 as the asynchronous circuit is susceptible of the PVT condition, it is difficult to predict a variation of the second delay time T2, which is generated during the operation of the digital circuit 120. On some occasions, as the first delay time T1, the second delay time T2 and the setup margin time Tsetup all vary, the total time of the first delay time T1, the second delay time T2 and the setup margin time Tsetup may be greater than the period of the clock signal CLK. This occasion is illustrated in FIG. 3. Referring FIG. 3, the total time of the first delay time T1, the second delay time T2 and the setup margin time Tsetup is greater than the period of the clock signal CLK. Consequently, the final digital signal FDGT_OUT<0:M> is outputted in synchronization with not the second edge R2 of the clock signal CLK, but a third edge R3 of the clock signal CLK.

As such, when it is difficult to predict the timing error according to the variations of the PVT conditions, the integrated circuit 100 will be deteriorated in terms of operation reliability. Particularly, timing errors increase in magnitude, as a frequency of the clock signal CLK becomes higher to achieve high speed operations of the integrated circuit 100.

As an attempt to address the above described features with respect to operation reliability, an integrated circuit 200 in FIGS. 4 and 5 has been proposed. An integrated circuit 200 includes a delay replica unit 240, which delays the clock signal CLK by the total time of the first delay time T1, the second delay time T2 and the setup margin time Tsetup, and provides the delayed clock signal CLK_DELY with the alignment unit 130. The delay replica unit 240 is a replica element that somewhat reflects the variation of the first delay time T1, the second delay time T2 and the setup margin time Tsetup in the real path through the digital counter 110, the digital circuit 120 and the alignment unit 130 in generating the delayed clock signal CLK_DELY. However, it is difficult to implement the delay replica unit 240. Further, if the delay replica unit 240 is embodied as a circuit identical to the real path, the size of the circuit will be large and power consumption increases.

SUMMARY OF THE INVENTION

An embodiment of the present invention is directed to an integrated circuit which outputs a digital signal in synchronization with a designated clock edge, regardless of a variation of PVT conditions and method for driving the integrated circuit.

In accordance with an embodiment of the present invention, an integrated circuit includes: a counter configured to perform a counting operation, and output a count code value; an operation controller configured to receive the count code value and generate a first control signal and a second control signal, wherein the first control signal is generated when the count code value is equal to a first value, which is counted by the counter prior to counting a target count value, and the second control signal is generated when the count code value is equal to the target count value; a digital circuit configured to perform a first operation based on the first control signal and output a digital signal; and an alignment unit configured to align the digital signal and output the aligned digital signal as a final digital signal in response to the second control signal.

In accordance with an embodiment of the present invention, a method for driving an integrated circuit having a digital circuit, includes: performing a counting operation, and outputting a count code value; receiving the count code value, detecting a first count code value and generating a first control signal based on the first count code value, wherein the first count code value is counted during the counting operation prior to counting a target count value; receiving the count code value, detecting a second count code value corresponding to the target count value, and generating a second control signal based on the second count code value; in the digital circuit, outputting a digital signal from the digital circuit in response to the first count code value; latching the digital signal outputted from the digital circuit and outputting the latched digital signal as a first digital signal in response to the second control signal; and latching the first digital signal and outputting the latched first digital signal as a final digital signal in response to a clock signal.

In accordance with another embodiment of the present invention, a method for driving an integrated circuit having a digital circuit, includes: performing a counting operation, and outputting a count code value; receiving the count code value, detecting a first count code value, and generating a first control signal based on the first count code value, wherein the first count code value is counted during the counting operation prior to counting a target count value; receiving the count code value, detecting a second count code value corresponding to the target count value, and generating a second control signal based on the second count code value; outputting a digital signal from the digital circuit in response to the first count code value; latching the digital signal outputted from the digital circuit and outputting the latched digital signal; and generating a reset signal for resetting the digital circuit and the latch, when the second control signal is not generated for more than a first period of time.

BRIEF DESCRIPTION OF THE DRAWINGS

FIGS. 12A and 12B illustrate a timing diagram for illustrating a driving operation of the integrated circuit in accordance with the embodiment of the present invention.

DESCRIPTION OF SPECIFIC EMBODIMENTS

Figure 1:
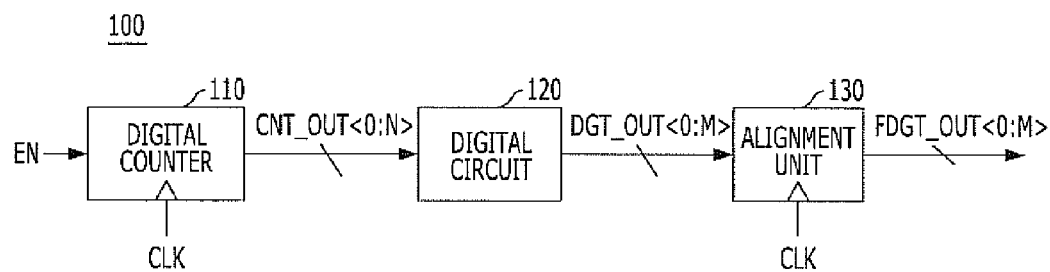
FIG. 1 illustrates a block diagram of a conventional integrated circuit having a digital circuit.
Figure 2:
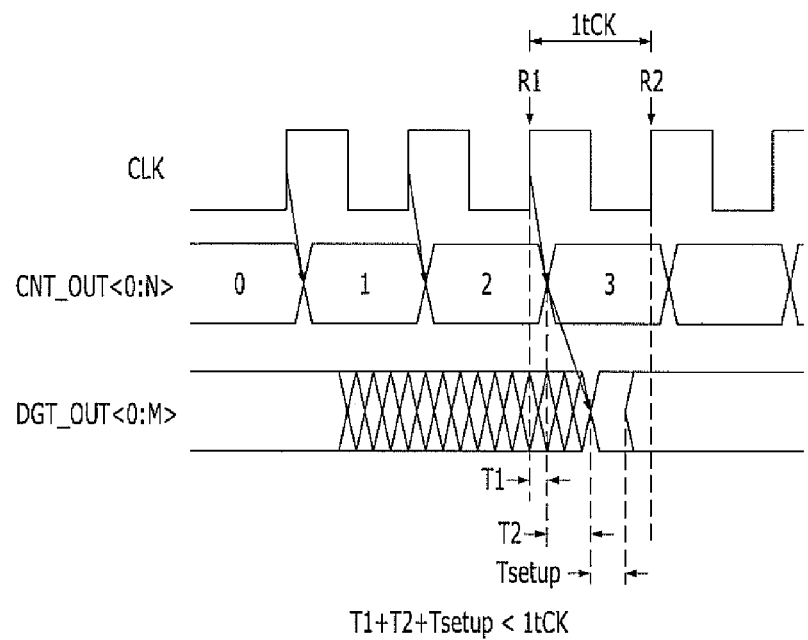
FIGS. 2 and 3 illustrate a timing diagram for illustrating an driving operation of the integrated circuit shown in FIG. 1.
Figure 3:
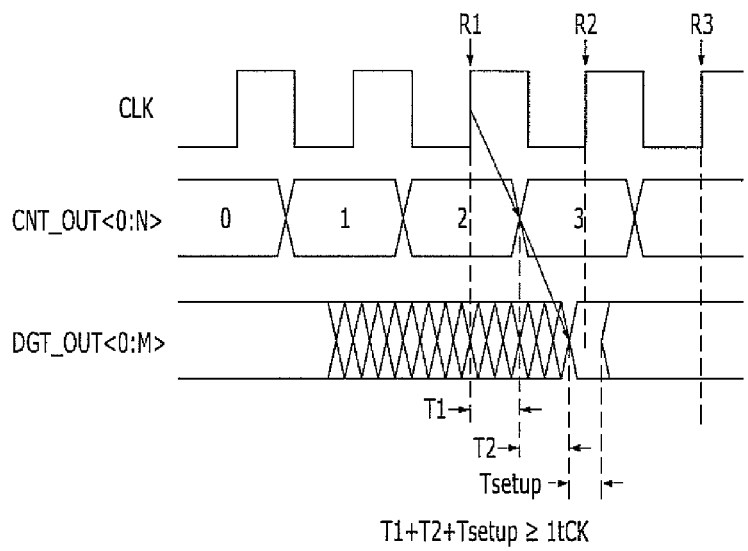
Figure 4:
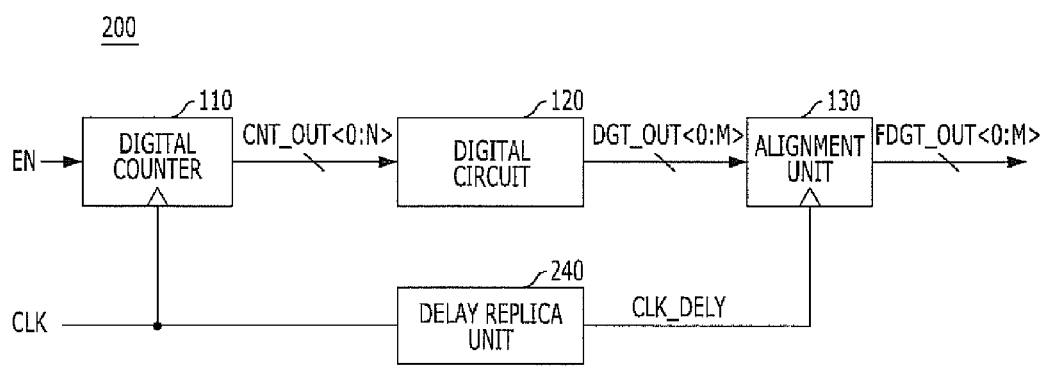
FIG. 4 illustrates a block diagram of another conventional integrated circuit having a digital circuit.
Figure 5:
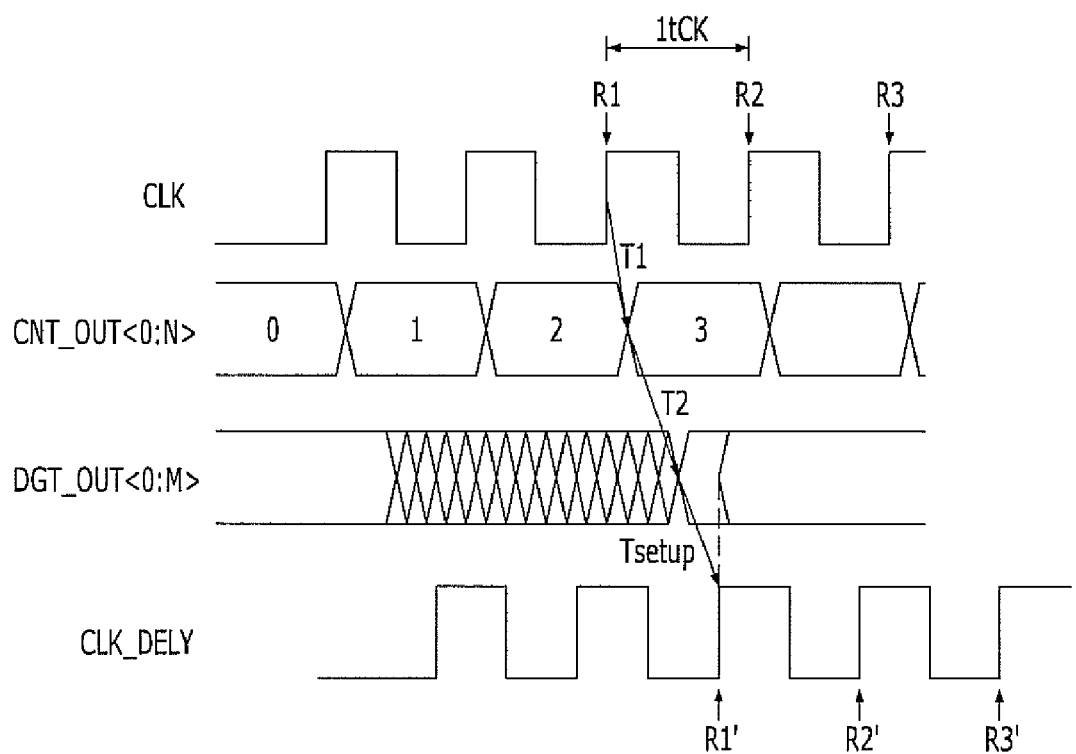
FIG. 5 illustrates a timing diagram for illustrating an driving operation of the integrated circuit shown in FIG. 4.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 6:
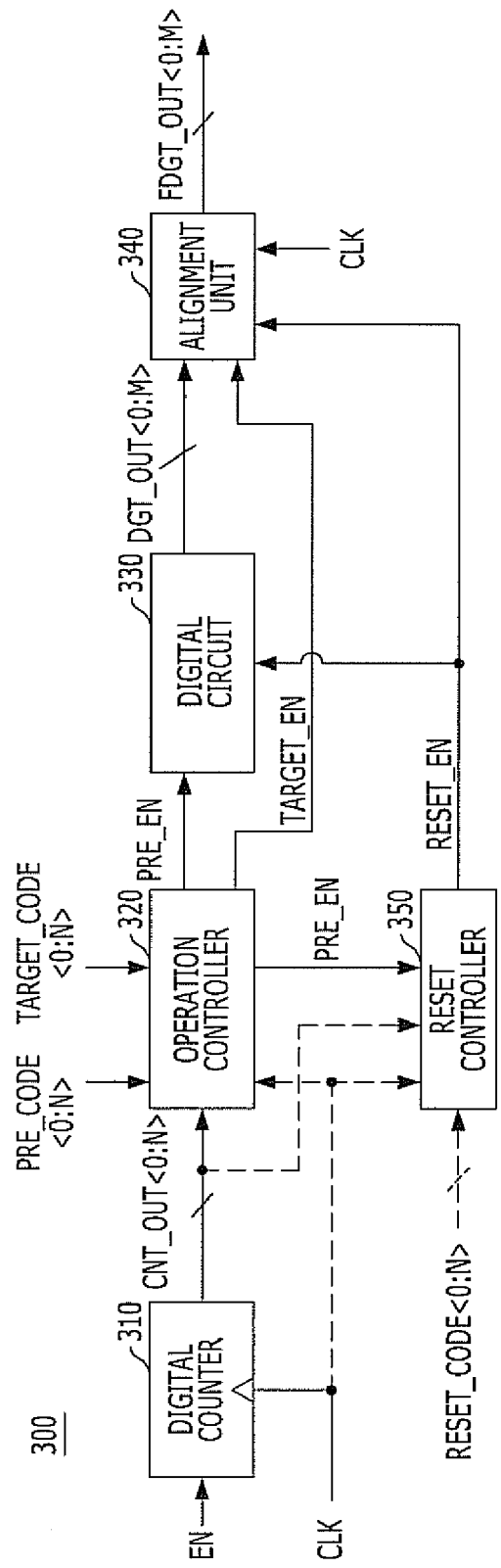
FIG. 6 illustrates a block diagram of an integrated circuit having a digital circuit in accordance with an embodiment of the present invention.
Figure 7:
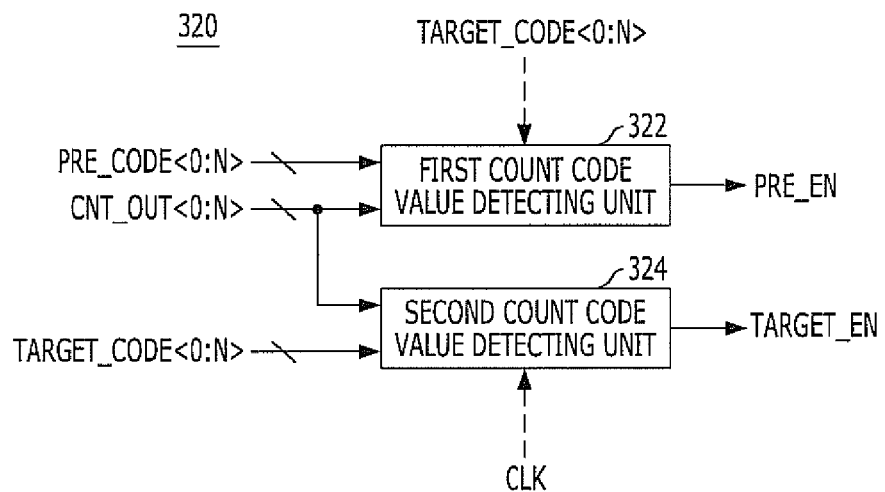
FIG. 7 illustrates a detailed block diagram of the operation controller shown in FIG. 6.
Figure 8A:
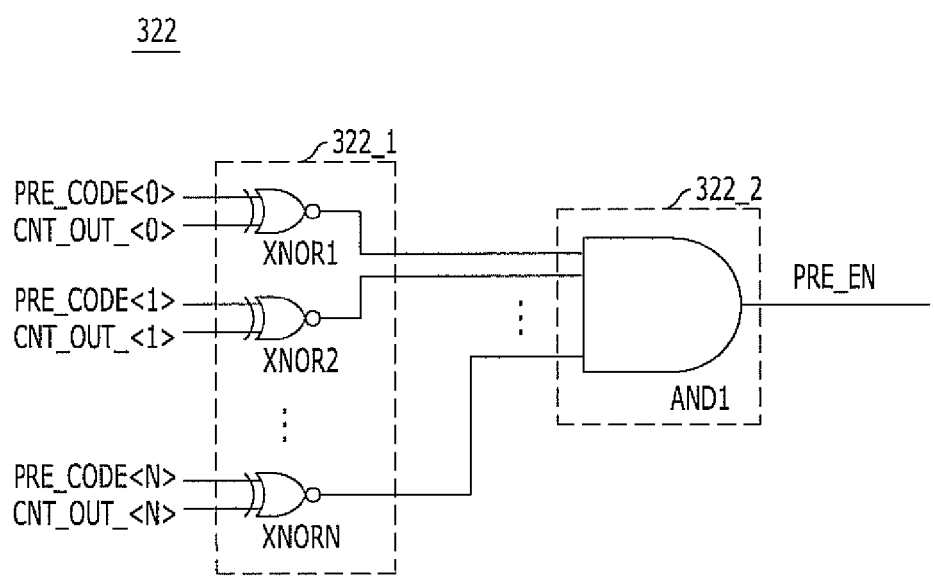
FIGS. 8A and 8B illustrate a detailed circuit diagram of the first count code value detecting unit shown in FIG. 7, respectively.
Figure 8B:
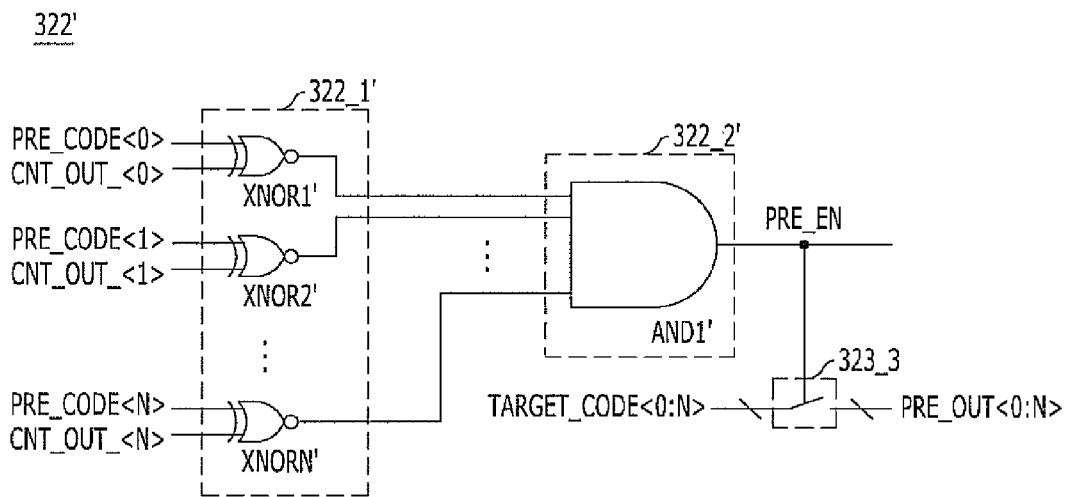
Figure 9:
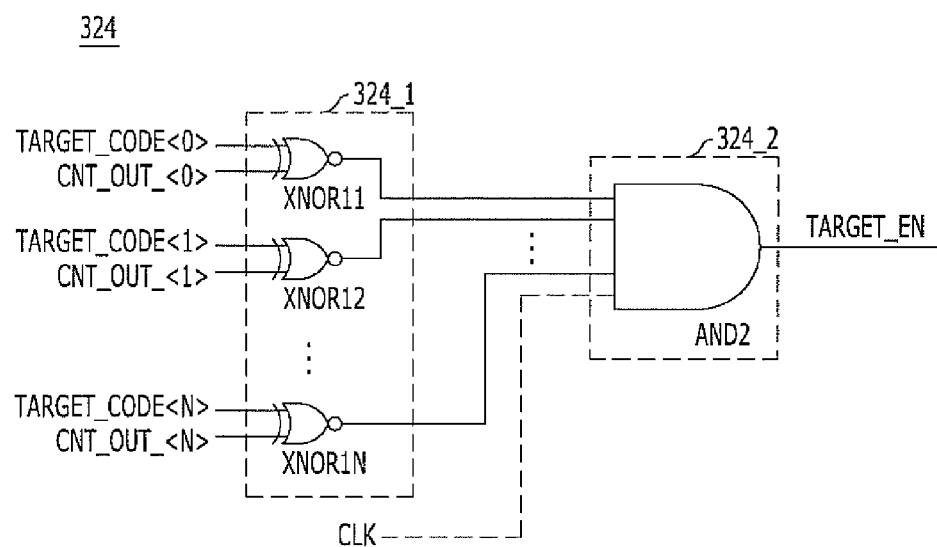
FIG. 9 illustrates a detailed circuit diagram of the second count code value detecting unit shown in FIG. 7.
Figure 10:
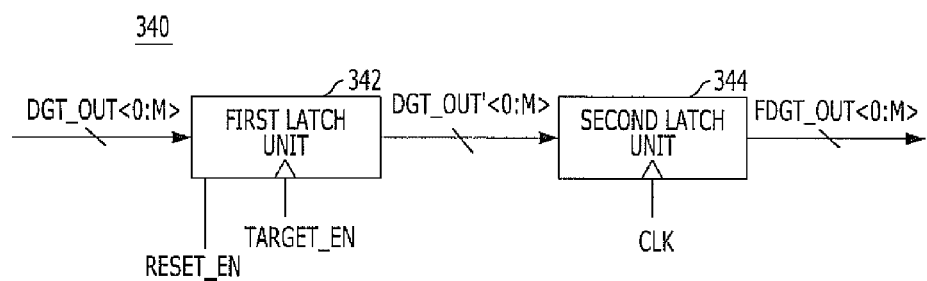
FIG. 10 illustrates a detailed block diagram of the alignment unit shown in FIG. 6.
Figure 11A:
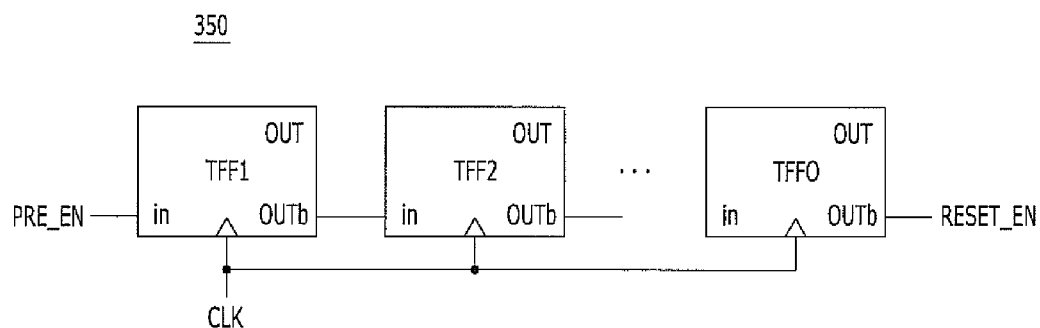
FIGS. 11A and 11B illustrate a detailed block diagram of the reset controller shown in FIG. 6, respectively.
Figure 11B:
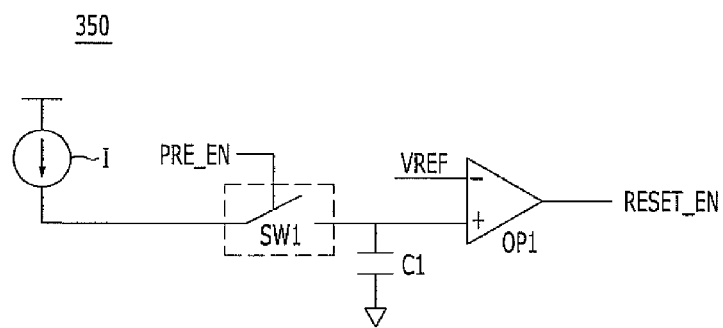

FIG. 6 illustrates a block diagram of an integrated circuit having a digital circuit in accordance with an embodiment of the present invention, FIG. 7 illustrates a detailed block diagram of the operation controller 320 shown in FIG. 6, FIGS. 8A and 8B illustrate a detailed circuit diagram of the first count code value detecting unit 322 shown in FIG. 7, respectively, FIG. 9 illustrates a detailed circuit diagram of the second count code value detecting unit 324 shown in FIG. 7, FIG. 10 illustrates a detailed block diagram of the alignment unit 340 shown in FIG. 6, and FIGS. 11A and 11B illustrate a detailed block diagram of the reset controller 350 shown in FIG. 6, respectively.

Referring to FIG. 6, an integrated circuit 300 includes a digital counter 310, an operation controller 320, a digital circuit 330, and an alignment unit 340. The digital counter 310 performs a counting operation in sequence in response to an enable signal EN and a clock signal CLK and outputs a count code value CNT_OUT<0:N>. The operation controller 320 generates a first enable pulse PRE_EN, when the count code value CNT_OUT<0:N> is equal to a pre-count value, which is counted prior to a target count value for outputting a final digital signal FDGT_OUT<0:M>, and generates a second enable pulse TARGET_EN, when the count code value CNT_OUT<0:N> is equal to the target count value. For example, the pre-count value may be a count value that is counted just before the target count value. The digital circuit 330 is an asynchronous circuit and performs an intended operation in response to the first enable pulse PRE_EN. The alignment unit 340 aligns a digital signal DGT_OUT<0:M> outputted from the digital circuit 330 and outputs the aligned digital signal as the final digital signal FDGT_OUT<0:M> in response to the second enable pulse TARGET_EN and the clock signal CLK. The integrated circuit 300 further includes a reset controller for resetting the digital circuit 330 and the alignment unit 340.

The digital counter 310 is enabled in response to the enable signal EN, performs a counting operation in synchronization with a clock edge of the clock signal CLK, and outputs the counting result as the count code value CNT_OUT<0:N>. If the count code value CNT_OUT<0:N> is a 4-bit signal CNT_OUT<0:3>, the digital counter 310 will output count values in a sequence such as 0, 1, 2, 3, . . . based on a logical combination of the 4-bit signal CNT_OUT<0:3>. For example, the digital counter 310 outputs the count code value CNT_OUT<0:3> of "0000" to indicate a count value "0", and outputs the count code value CNT_OUT<0:3> of "0011" to indicate a count value "3".

Referring to FIG. 7, the operation controller 320 includes a first count code value detecting unit 322, and a second count code value detecting unit 324. The first count code value detecting unit 322 receives the count code value CNT_OUT<0:N> and a pre-code value PRE_CODE<0:N>, detects the count code value CNT_OUT<0:N> corresponding to the pre-count value PRE_CODE<0:N>, and generates the first enable pulse PRE_EN based on the detected count code value CNT_OUT<0:N>. The second count code value detecting unit 324 receives the count code value CNT_OUT<0:N> and a target code value TARGET_CODE<0:N>, detects the count code value CNT_OUT<0:N> corresponding to the target count value TARGET_CODE<0:N>, and generates the second enable pulse TARGET_EN based on the detected count code value CNT_OUT<0:N>.

Referring to FIG. 8A, the first count code value detecting unit 322 includes a first comparison unit 322_1, and a first pulse output unit 322_2. The first comparison unit 322_1 compares the count code value CNT_OUT<0:N> with the pre-code value PRE_CODE<0:N>. The first pulse output unit 322_2 outputs the first enable pulse PRE_EN in response to the comparison result of the first comparison unit 322_1. The first comparison unit 322_1 includes N number of exclusive NOR gates XNOR1 to XNORN. Each of the exclusive NOR gates XNOR1 to XNORN receives a respective bit of the count code value CNT_OUT<0:N> and a respective bit of the pre-code value PRE_CODE<0:N> and outputs a logically high level signal, when logic levels of the respective bits of the count code value CNT_OUT<0:N> and pre-code value PRE_CODE<0:N> are the same. The first pulse output unit 322_2 performs an AND operation for outputs of the first comparison unit 322_1. That is, the first pulse output unit 322_2 performs an AND operation for outputs of N number of exclusive NOR gates XNOR1 to XNORN. The first pulse output unit 322_2 outputs the AND operation result as the first enable pulse PREEN. As can be seen from FIG. 8B, the first pulse output unit 322_2 may include a switching unit 323_3 for providing the target count value TARGET_CODE<0:N> as a detected code value PRE_OUT<0:N> with the digital circuit 330 in response to the first enable pulse PRE_EN. If the digital circuit 330 has a single input, the first count code value detecting unit 322 may be embodied as shown in FIG. 8A. If the digital circuit 330 has multiple inputs, according to an example, the first count code value detecting unit 322 may be embodied as shown in FIG. 8B.

Referring to FIG. 9, the first count code value detecting unit 324 includes a second comparison unit 324_1, and a second pulse output unit 324_2. The second comparison unit 324_1 compares the count code value CNT_OUT<0:N> with the target code value TARGET_CODE<0:N>. The second pulse output unit 324_2 outputs the second enable pulse TARGET_EN in response to the comparison result of the second comparison unit 324_1. The second comparison unit 324_1 includes N number of exclusive NOR gates XNOR11 to XNOR1N. Each of the exclusive NOR gates XNOR11 to XNOR1N receives a respective bit of the count code value CNT_OUT<0:N> and target code value TARGET_CODE<0:N> and outputs a logically high level signal, when logic levels of two respective bits of the count code value CNT_OUT<0:N> and target code value TARGET_CODE<0:N> are the same. The second pulse output unit 324_2 performs an AND operation for outputs of the second comparison unit 324_1. That is, the second pulse output unit 324_2 performs an AND operation for outputs of N number of exclusive NOR gates XNOR11 to XNOR1N. The second pulse output unit 324_2 outputs the AND operation result as the second enable pulse TARGET_EN. Alternatively, the second pulse output unit 324_2 may receive outputs of the second comparison unit 324_1 as well as the clock signal CLK and output the second enable pulse TARGET_EN in synchronization with the clock signal CLK.

Referring to FIG. 10, the alignment unit 340 includes a first latch unit 342 and a second latch unit 344. The first latch unit 342 latches the digital signal DGT_OUT<0:M> from the digital circuit 330 and outputs the latched digital signal as a first digital signal DGT_OUT'<0:M> in response to the second enable pulse TARGET_EN. The second latch unit 344 latches the first digital signal DGT_OUT'<0:M> from the first latch unit 342 and outputs the latched first digital signal as the final digital signal FDGT_OUT<0:M> in synchronization with the clock signal CLK. The first latch unit 342 and the second latch unit 344 may include flip-flops.

Referring to FIG. 11A, the reset controller 350 may include a plurality of T flip-flops TFF1 to TFF0, which delay the first enable pulse PRE_EN for a desired period of the clock signal CLK and output a reset signal RESET_EN. Also, as can be seen from FIG. 11B, the reset controller 350 may include a current source I, a switching unit SW1, a capacitor C1, and an operational amplifier OP1, which output the reset signal RESET_EN, after a desired period (RC time) of the clock signal CLK in response to the first enable pulse PRE_EN. Alternatively, the reset controller 350 may include an element identical to the first count code value detecting unit 322 as shown in FIG. 8A, which compares the count code value CNT_OUT<0:N> with a designated reset code value, detects the count code value CNT_OUT<0:N> corresponding to the reset code value, and outputs the reset signal RESET_EN based on the detected count code value CNT_OUT<0:N>.

A driving operation of the integrated circuit 300 in accordance with the embodiment of the present invention will be described below with reference to FIGS. 12A and 12B.

Hereinafter, the driving operation will be described under the assumption that the target count value is "3", and the pre-count value "2". Thus, the digital circuit 330 performs an intended operation, not when the count code value CNT_OUT<0:N> is equal to the target count value "3", but when the count code value CNT_OUT<0:N> is equal to the pre-count value "2", to thereby allow enough timing margin.

FIG. 12A illustrates a timing diagram in accordance with the case that total delay time T1+T2+Tsetup for the final digital signal FDGT_OUT<0:M> is less than one period 1tCK of the clock signal CLK.

FIG. 12B illustrates a timing diagram in accordance with the case that total delay time T1+T2+Tsetup for the final digital signal FDGT_OUT<0:M> is more than one period 1tCK of the clock signal CLK.

Referring to FIG. 12A, the digital counter 310 is enabled in response to the enable signal EN (not shown), performs a counting operation in synchronization with a rising edge of the clock signal CLK, and outputs the count code value CNT_OUT<0:N> counted in sequence. If the count code value CNT_OUT<0:N> is a 4-bit signal CNT_OUT<0:3>, the digital counter 310 will output count values in sequence (for example, in the order of 0, 1, 2, 3, . . . ) based on a logical combination of the 4-bit signal CNT_OUT<0:3>. For example, the digital counter 310 outputs the count code value CNT_OUT<0:3> of "0000" to indicate a count value "0" and outputs the count code value CNT_OUT<0:3> of "0011" to indicate a count value "3". If the count code value CNT_OUT<0:3> is outputted in the following order: "0000"→"0001"→"0010"→"0011"→"0100"→ . . . , the corresponding count value will be changed in the following order: "0"→"1"→"2"→"3"→"4"→ . . . . Substantially, during the transmission through the digital counter 310, the count code value CNT_OUT<0:N> is delayed and outputted later than the rising edge of the clock signal CLK by the first delay time T1.

Then, the operation controller 320 receives the count code value CNT_OUT<0:N>, detects the count code value CNT_OUT<0:N> corresponding with the pre-count value "2", and detects the count code value CNT_OUT<0:N> corresponding with the target count value "3". In other words, the first count code value detecting unit 322 compares the received count code value CNT_OUT<0:N> with the pre-code value PRE_CODE<0:N> to determine whether the received count code value CNT_OUT<0:N> is the same as the pre-code value PRE_CODE<0:N> or not. The second count code value detecting unit 324 compares the received count code value CNT_OUT<0:N> with the target count value TARGET_CODE<0:N> to determine whether the received count code value CNT_OUT<0:N> is the same as the target count value TARGET_CODE<0:N> or not.

Because the count code value CNT_OUT<0:N> corresponding to the pre-count value "2" is counted before the count code value CNT_OUT<0:N> corresponding to the target count value "3" is counted, the first count code value detecting unit 322 detects the count code value CNT_OUT<0:N> corresponding to the pre-count value "2" earlier than the second count code value detecting unit 324. That is, the first count code value detecting unit 322 detects the count code value CNT_OUT<0:N> corresponding to the pre-count value "2", when the received count code value CNT_OUT<0:N> synchronized with a first rising edge R11 of the clock signal CLK is the same as the pre-code value PRE_CODE<0:N>. Therefore, the first count code value detecting unit 322 supplies the first enable pulse PRE_EN to the digital circuit 330.

Then, the digital circuit 330 performs an intended operation in advance before the operation controller detects that the count code value CNT_OUT<0:N> is received from the digital counter 310, and outputs the digital signal DGT_OUT<0:M> in advance. During the transmission of the digital signal DGT_OUT<0:M> in response to the first enable pulse PRE_EN, a second delay time T2 occurs. Also, there exists a setup margin time Tsetup between the digital signal DGT_OUT<0:M> and the clock signal CLK. The digital signal DGT_OUT<0:M> is latched by the first latch unit 342.

Then, the second count code value detecting unit 324 of the operation controller 320 detects the count code value CNT_OUT<0:N> corresponding with the target count value "3". That is, the second count code value detecting unit 324 detects the count code value CNT_OUT<0:N> corresponding with the target count value "3", when the received count code value CNT_OUT<0:N> synchronized with a second rising edge R12 of the clock signal CLK is the same as the target code value TARGET_CODE<0:N>. Therefore, the second count code value detecting unit 324 supplies the second enable pulse TARGET_EN to the first latch unit 342.

Finally, the first latch unit 342 of the alignment unit 340 latches the digital signal DGT_OUT<0:M> from the digital circuit 330 and outputs the first digital signal DGT_OUT'<0:M> latched responsive to the second enable pulse TARGET_EN to the second latch unit 344. The second latch unit 344 latches the first digital signal DGT_OUT'<0:M> from the first latch unit 342 and outputs the latched first digital signal as the final digital signal FDGT_OUT<0:M> in synchronization with a third rising edge R13 of the clock signal CLK. At this time, if the alignment unit 340 includes only the second latch unit 344 and not the first latch unit 342, the final digital signal FDGT_OUT<0:M> is outputted in synchronization with the second rising edge R12. Therefore, according to an example, the first latch unit 342 is useful for proper synchronization of the final digital signal FDGT_OUT<0:M> with the clock signal CLK.

Thus, if the total delay time T1+T2+Tsetup (that is, a sum of the first delay time T1, the second delay time T2, and the setup margin time Tsetup) is less than one period 1tCK of the clock signal CLK, the final digital signal FDGT_OUT<0:M> is synchronized with the third rising edge R13 of the clock signal CLK and the final digital signal FDGT_OUT<0:M> synchronized with the third rising edge R13 of the clock signal CLK is outputted.

Referring to FIG. 12B, the digital counter 310 is enabled in response to the enable signal EN (not shown), performs a counting operation in synchronization with the rising edge of the clock signal CLK and outputs the count code value CNT_OUT<0:N> counted in sequence. During the transmission through the digital counter 310, the count code value CNT_OUT<0:N> is delayed and outputted later than the rising edge of the clock signal CLK by the first delay time T1.

Then, the operation controller 320 receives the count code value CNT_OUT<0:N>, detects the count code value CNTOUT<0:N> corresponding with the pre-count value "2", and detects the count code value CNT_OUT<0:N> corresponding to the target count value "3".

Because the count code value CNT_OUT<0:N> corresponding to the pre-count value "2" is counted before the count code value CNT_OUT<0:N> corresponding to the target count value "3" is counted, the first count code value detecting unit 322 detects the count code value CNT_OUT<0:N> corresponding to the pre-count value "2"

earlier than the second count code value detecting unit 324. That is, the first count code value detecting unit 322 detects the count code value CNT_OUT<0:N> corresponding to the pre-count value "2", when the received count code value CNT_OUT<0:N> synchronization with a first rising edge R11' of the clock signal CLK is the same as the pre-code value PRE_CODE<0:N>. Therefore, the first count code value detecting unit 322 supplies the first enable pulse PRE_EN to the digital circuit 330.

Then, the digital circuit 330 performs an intended operation in advance and outputs the digital signal DGT_OUT<0:M> in advance. During the transmission of the digital signal DGT_OUT<0:M> in response to the first enable pulse PRE_EN, the second delay time T2 occurs. Also, there exists the setup margin time Tsetup between the digital signal DGT_OUT<0:M> and the clock signal CLK. The digital signal DGT_OUT<0:M> is latched by the first latch unit 342.

At this time, the second count code value detecting unit 324 of the operation controller 320 detects the count code value CNT_OUT<0:N> corresponding to the target count value "3". That is, the second count code value detecting unit 324 detects the count code value CNT_OUT<0:N> corresponding to the target count value "3", when the received count code value CNT_OUT<0:N> synchronized with a second rising edge R12' of the clock signal CLK is the same as the target code value TARGET_CODE<0:N>. Therefore, the second count code value detecting unit 324 supplies the second enable pulse TARGET_EN to the first latch unit 342.

Finally, the first latch unit 342 of the alignment unit 340 latches the digital signal DGT_OUT<0:M> from the digital circuit 330 and outputs the first digital signal DGT_OUT'<0:M> latched responsive to the second enable pulse TARGET_EN to the second latch unit 344. The second latch unit 344 latches the first digital signal DGT_OUT'<0:M> from the first latch unit 342 and outputs the latched first digital signal as the final digital signal FDGT_OUT<0:M> in synchronization with a third rising edge R13' of the clock signal CLK.

Thus, if the total delay time T1+T2+Tsetup (that is, a sum of the first delay time T1, the second delay time T2, and the setup margin time Tsetup), is more than one period 1tCK of the clock signal CLK, the final digital signal FDGT_OUT<0:M> is synchronized with the third rising edge R13' of the clock signal CLK and the final digital signal FDGT_OUT<0:M> synchronized with the third rising edge R13' of the clock signal CLK is outputted. For example, use of the second enable signal TARGET_EN as a trigger signal for the first latch unit 342, instead of the second rising edge R12' that triggers too early ahead of the output of the digital signal DGT_OUT<0:M> in this case to be used as a trigger signal, to latch the digital signal DGT_OUT'<0:M> enables the digital signal DGT_OUT'<0:M> to be latched properly for being output in response to the third rising edge R13' from the second latch unit 344.

In sum, as can be seen from FIGS. 12A and 12B, even if the total delay time T1+T2+Tsetup is less or more than one period 1tCK of the clock signal CLK, the final digital signal FDGT_OUT<0:M> is synchronized with the third rising edge R13/R13' of the clock signal CLK and the final digital signal FDGT_OUT<0:M> synchronized with the third rising edge R13/R13' of the clock signal CLK is outputted.

Accordingly, the embodiment of the present invention outputs the final digital signal in synchronization with the intended clock edge, regardless of a variation of internal delay time based on a variation of PVT conditions, thereby prevents malfunction based on the timing error.

Figure 13:
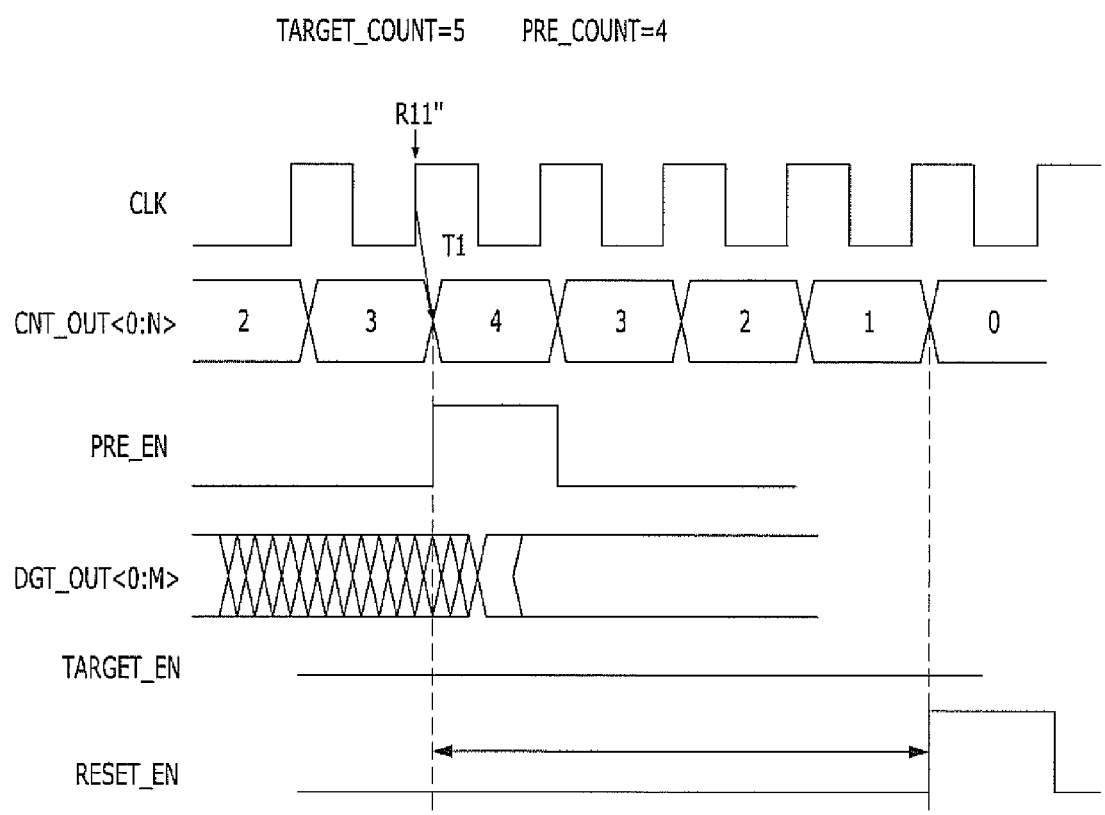
FIG. 13 illustrates a timing diagram for illustrating a reset process of the driving operation of the integrated circuit in accordance with the embodiment of the present invention.

FIG. 13 illustrates a timing diagram for illustrating a reset process of the driving operation of the integrated circuit 300 in accordance with the embodiment of the present invention.

Hereinafter, the reset operation will be described under the assumption that the pre-count value "4", and the target count value is "5". It is noted that the reset process is performed, when the count code value CNT_OUT<0:N> does not reach the target count value "5".

Referring to FIG. 13, the first count code value detecting unit 322 compares the count code value CNT_OUT<0:N> outputted from the digital counter 310 with the pre-code value PRE_CODE<0:N>, whether the count code value CNT_OUT<0:N> is the same as the pre-code value PRE_CODE<0:N> or not. The second count code value detecting unit 324 compares the count code value CNT_OUT<0:N> outputted from the digital counter 310 with the target code value TARGET_CODE<0:N>, whether the count code value CNT_OUT<0:N> is the same as the target code value TARGET_CODE<0:N> or not. In detail, the first count code value detecting unit 322 detects whether the count code value CNT_OUT<0:N>, which is synchronized with a first rising edge R11" of the clock signal CLK and outputted from the digital counter 310, is the same as the pre-code value PRE_CODE<0:N>, and outputs the detection result as the first enable pulse PRE_EN to the digital circuit 330. The digital circuit 330 performs a designated operation in response to the first enable pulse PRE_EN and outputs the digital signal DGT_OUT<0:M>. The first latch unit 342 latches the digital signal DGT_OUT<0:M>.

At this time, when the second enable pulse TARGET_EN is not outputted from the second count code value detecting unit 324 for a designated time, the reset controller 350 generates and outputs the reset signal RESET_EN to the digital circuit 330 and the first latch unit 342 of the alignment unit 340. In detail, the reset controller 350, which is enabled by the first enable pulse PRE_EN, generates and outputs the reset signal RESET_EN to the digital circuit 330 and the first latch unit 342, when the count code value CNT_OUT<0:N> is the same as a designated reset code value (not shown). In FIG. 13, when the count code value CNT_OUT<0:N> is equal to the reset count value "0", the reset signal RESET_EN is enabled. In this manner, the reset controller 350 generates the reset signal RESET_EN, when the count code value CNT_OUT<0:N> reaches a certain code value. Alternatively, the reset signal RESET_EN may be generated, after a certain number of periods of the clock signal CLK from a generation time of the first enable pulse PRE_EN. Also, the reset signal RESET_EN may be generated, after a designated time from a generation time of the first enable pulse PRE_EN. For example, the reset signal RESET_EN may be generated, after the designated time, which is determined by RC constant, from a generation time of the first enable pulse PRE_EN.

Thus, when the reset controller 350 generates the reset signal RESET_EN, the digital circuit 330 and the first latch unit 342 of the alignment unit 340 are reset in response to the reset signal RESET_EN.

As described above, the embodiment of the present invention outputs the final digital signal in synchronization with the designated clock edge, regardless of a variation of internal delay time based on a variation of PVT conditions, thereby prevents malfunction based on the timing error.

While the present invention has been described with respect to the specific embodiments, it will be apparent to those skilled in the art that various changes and modifications may be made without departing from the spirit and scope of the invention as defined in the following claims. For example, in the embodiment of the present invention, the pre-count value is set as a count value that is counted just before the target count value. However, the pre-count value may be set as a value that is previous counted by appropriate number prior to the target count value, according to the frequency of the clock signal or the total delay time.

What is claimed is:

1. An integrated circuit comprising:
   a counter configured to perform a counting operation and output a count code value;
   an operation controller configured to receive the count code value and generate a first control signal and a second control signal, wherein the first control signal is generated when the count code value is equal to a first value, which is counted by the counter prior to counting a target count value, and the second control signal is generated when the count code value is equal to the target count value;
   a digital circuit configured to perform a first operation based on the first control signal and output a digital signal; and
   an alignment unit configured to align the digital signal and output the aligned digital signal as a final digital signal in response to the second control signal.

2. The integrated circuit of claim 1, wherein the first value is a count value counted immediately before the target count value.

3. The integrated circuit of claim 1, wherein the counter and the alignment unit is configured to operate in synchronization with a clock signal.

4. The integrated circuit of claim 1, wherein the operation controller comprises:
   a first count code value detecting unit configured to receive the count code value and the first value, detect a first count code value corresponding to the first value, and generate the first control signal based on the first count code value; and
   a second count code value detecting unit configured to receive the count code value and a target code value, detect a second count code value corresponding to the target count value, and generate the second control signal based on the second count code value.

5. The integrated circuit of claim 4, wherein the first count code value detecting unit comprises:
   a first comparison unit configured to compare the count code value with the first value; and
   a first pulse output unit configured to output the first control signal in response to the comparison result of the first comparison unit.

6. The integrated circuit of claim 4, wherein the second count code value detecting unit comprises:
   a second comparison unit configured to compare the count code value with the target code value; and
   a second pulse output unit configured to output the second control signal in response to the comparison result of the second comparison unit.

7. The integrated circuit of claim 6, wherein the second pulse output unit is configured to output the second control signal in synchronization with a clock signal.

8. The integrated circuit of claim 1, wherein the digital circuit is an asynchronous circuit.

9. The integrated circuit of claim 1, wherein the alignment unit comprises:
   a first latch unit configured to latch the digital signal from the digital circuit and output the latched digital signal as a first digital signal in response to the second control signal; and
   a second latch unit configured to latch the first digital signal from the first latch unit and output the latched first digital signal as the final digital signal in synchronization with a clock signal.

10. The integrated circuit of claim 9, further comprising a reset controller configured to reset the digital circuit and the first latch unit.

11. The integrated circuit of claim 10, wherein the reset controller is configured to receive the count code value and a reset code value, detect when the count code value is equal to the reset code value, and output a reset signal based on the detected count code value.

12. The integrated circuit of claim 10, wherein the reset controller is configured to output the reset signal after a number of periods of the clock signal in response to the first control signal.

13. The integrated circuit of claim 10, wherein the reset controller is configured to output the reset signal after a period of time in response to the first control signal.

14. The integrated circuit of claim 1, wherein the alignment unit comprises:
   a first latch unit configured to latch the digital signal from the digital circuit and output the latched digital signal as a first digital signal in response to the second control signal.

15. The integrated circuit of claim 14, further comprising a reset controller configured to receive the first control signal and reset the first latch unit in response to the first control signal.

16. A method for driving an integrated circuit having a digital circuit, comprising:
   performing a counting operation and outputting a count code value;
   receiving the count code value, detecting a first count code value, and generating a first control signal based on the first count code value, wherein the first count code value is counted during the counting operation prior to counting a target count value;
   receiving the count code value, detecting a second count code value corresponding to the target count value, and generating a second control signal based on the second count code value;
   outputting a digital signal from the digital circuit in response to the first count code value;
   latching the digital signal outputted from the digital circuit and outputting the latched digital signal as a first digital signal in response to the second control signal; and
   latching the first digital signal and outputting the latched first digital signal as a final digital signal in response to a clock signal.

17. The method of claim 16, wherein the detecting of the first count code value comprises:
   comparing the count code value with the first count code value; and
   detecting the first count code value corresponding to the first code value.

18. The method of claim 16, wherein the detecting of the second count code value comprises:
   comparing the count code value with a target code value; and
   detecting the second count code value corresponding to the target count value.

19. A method for driving an integrated circuit having a digital circuit, comprising:
   performing a counting operation and outputting a count code value;

receiving the count code value, detecting a first count code value, and generating a first control signal based on the first count code value, wherein the first count code value is counted during the counting operation prior to counting a target count value;

receiving the count code value, detecting a second count code value corresponding to the target count value, and generating a second control signal based on the second count code value;

outputting a digital signal from the digital circuit in response to the first count code value;

latching the digital signal outputted from the digital circuit and outputting the latched digital signal; and generating a reset signal for resetting the digital circuit and the latch when the second control signal is not generated for more than a first period of time.

20. The method of claim 19, wherein the reset signal is generated when the count code value is equal to a reset code value.

* * * * *